United States Patent [19]

Chen et al.

[11] Patent Number: 5,653,801
[45] Date of Patent: Aug. 5, 1997

[54] METHOD FOR REDUCING CONTAMINATION IN SEMICONDUCTOR BY SELENIUM DOPING

[75] Inventors: Jyh-Chia Chen, Ellicott City; Zhenchun Huang, Baltimore, both of Md.

[73] Assignee: University of Maryland Baltimore County, Baltimore, Md.

[21] Appl. No.: 418,088

[22] Filed: Apr. 6, 1995

[51] Int. Cl.$^6$ .................................................. C30B 25/16
[52] U.S. Cl. ......................... 117/88; 117/2; 117/928
[58] Field of Search .............................. 117/1, 2, 88, 104, 117/108, 950, 928; 148/33.6; 437/141, 151, 162, 11

[56] References Cited

U.S. PATENT DOCUMENTS

| | | | |
|---|---|---|---|
| 2,975,048 | 3/1961 | Antell et al. | 75/706 |
| 3,297,403 | 1/1967 | Haache | 117/109 |
| 4,606,780 | 8/1986 | Leibenzender et al. | 148/171 |
| 4,855,250 | 8/1989 | Yamamoto et al. | 437/81 |
| 5,108,948 | 4/1992 | Murakami et al. | 437/110 |
| 5,182,229 | 1/1993 | Arimoto | 437/162 |
| 5,183,767 | 2/1993 | Baratte et al. | 437/11 |
| 5,387,544 | 2/1995 | Hayafuji | 437/151 |

OTHER PUBLICATIONS

"Properties of the Deep Donor States of Selenium Doped Aluminum Gallium Arsenide", Oh, E. G., et al.; J. Appl Phys. (1993), 72(2) pp. 1057–1071.

"Influence of Refilling Effects on Deep Level Transient Spectroscopy Measurements in Selenium Doped Aluminum Gallium Arsenide"; Enriquez, L. et al; J. Appl. Phys. (1992), 72(2), pp. 525–530.

"Transition Mechanisms of Two Interacting DX Centers in Type AlGaAs Using Reverse–Bias Deep Level Transient Spectroscopy and Temperature–Dependent Pulse–Width Reverse–Bias Deep Level Transient Spectroscopy Methods"; Wang, C. W. et al; J. Appl Phys. (15 Sep. 1993); vol. 74, No. 6, pp. 3921–3926.

"Effect of Se–Doping on Deep Impurities in Al$_x$Ga1–x As Grown by Metalorganic Chemical Vapor Deposition"; Chen, et al; J. of Elec Mat, vol. 24, No. 11, 1995, pp. 1677–1682.

"Reduction of Deep Level Impurities in Zn–Doped AlxGa1–xAs by a Co–Dopant Technique"; Chen, et al.; Jpn. J. Appl Phys. vol 34 (1995) pp. L476–L478.

*Primary Examiner*—Felisa Garrett
*Attorney, Agent, or Firm*—Lowe, Price, LeBlanc & Becker

[57] ABSTRACT

Contamination of aluminum-containing compound semiconductors is greatly reduced by an improved method for manufacturing the semiconductors, wherein the growing semiconductor crystal is doped with a predetermined concentration of selenium. The method of the present invention can be used to reduce contaminants in both p-type and n-type semiconductors.

11 Claims, No Drawings

METHOD FOR REDUCING CONTAMINATION IN SEMICONDUCTOR BY SELENIUM DOPING

TECHNICAL FIELD

This invention generally relates to methods for reducing contamination in semiconductors. This invention more particularly relates to an improved method for reducing the concentration of impurities in aluminum-containing compound semiconductors by doping the growing semiconductor crystal with a predetermined quantity of selenium.

BACKGROUND ART

Aluminum-containing compound semiconductors are an integral part of many of today's high-performance electronic and optoelectronic devices, such as laser diodes (LDs) and light emitting diodes (LEDs). One ternary semiconductor compound which is frequently used in these devices comprises epitaxial layers of aluminum gallium arsenide ($Al_xGa_{1-x}As$). Aluminum-containing semiconductor crystals are grown by a wide variety of known techniques, such as molecular beam epitaxy (MBE) and metalorganic chemical vapor deposition (MOCVD).

The efficiency and performance of devices which contain aluminum-based semiconductors are adversely effected by the presence of impurities in the semiconductor crystal. Some of the more common contaminants found in these semiconductors are oxygen and germanium. For example, contamination of the growing semiconductor with as little as 1 part per million of oxygen in the vapor phase will result in concentrations of oxygen in excess of $10^{19}$ $cm^3$ in the $Al_xGa_{1-x}As$ solid. These impurities are typically found in the source materials used to grow the semiconductor, as well as in the growth apparatus itself. Reducing the presence of the so-called "deep level" contaminants has proven to be a significant challenge to those attempting to produce high quality $Al_xGa_{1-x}As$ semiconductor crystals.

One known method for reducing the concentration of deep-level impurities in n-type or p-type AlGaAs semiconductors is to purify separately each of the component elements used to produce the alloy. In U.S. Pat. No. 2,975,048, for example, each component element of a semiconductor compound (GaAs) is purified through oxidation, isolation of the impurity oxide, and finally, reduction of the pure oxide. Such a method, however, requires expensive gettering devices, filtration systems, and/or source purification techniques, greatly adding to the cost and complexity of the crystal growth process. Moreover, the level of purity achieved by such techniques is not sufficient for many of today's advanced semiconductor applications. Nor will such techniques completely remove all oxygen and germanium impurities.

Other methods for producing high-purity semiconductor materials have been proposed. For example, U.S. Pat. No. 3,297,403 discloses a method for preparing a semiconductor compound by selectively melting the elements which make up the compound in an evacuated ampoule. This method adds to the complexity and expense of the semiconductor growth process. Moreover, the level of compound purity achieved by the method of the '403 patent is insufficient for today's high-speed LDs and LEDs.

OBJECTS OF THE INVENTION

It is an object of the present invention to reduce the levels of contamination found in semiconductors.

It is another object of the present invention to develop a simplified method for producing high-purity aluminum-containing compound semiconductors.

It is yet another object of the present invention to provide an improved method for reducing the presence of deep-level contaminants, such as oxygen and germanium, from semiconductors without adding significantly to the cost of manufacture.

It is still another object of the present invention to improve the performance and extend the useful lifetime of devices that employ aluminum-containing compound semiconductors.

Other objects and advantages of the present invention will become readily apparent to those skilled in this art from the following detailed description, wherein the preferred embodiment of the invention is shown and described simply by way of illustration of the best mode contemplated for carrying out the invention.

DISCLOSURE OF THE INVENTION

According to the present invention, the foregoing objectives and advantages are attained by providing a means for growing one or more aluminum-containing compound semiconductor crystals, growing the semiconductor crystals by the growth means, and while the crystals are growing, simultaneously delivering thereto a predetermined quantity of selenium (i.e., "doping"). The selenium doping process results in the production of a semiconductor crystal having greatly reduced levels of oxygen and germanium contaminants.

BRIEF DESCRIPTION OF THE DRAWINGS

FIG. 1—Deep level transient spectroscopy (DLTS) spectrum measurement for n-type $Al_{0.22}Ga_{0.78}As$ semiconductor doped with selenium.

FIG. 2—Deep level densities versus selenium doping concentrations for n-type $Al_{0.22}Ga_{0.78}As$ semiconductor.

FIG. 3—Carrier concentration profile of undoped AlGaAs on selenium-doped AlGaAs layer.

FIG. 4—DLTS depth distribution of electron traps E1, E2 and E3 for n-type semiconductor.

FIG. 5—DLTS spectrum measurement for n-type $Al_{0.22}Ga_{0.78}As$ semiconductors doped with increased concentrations of selenium.

FIG. 6—DLTS spectrum measurement for Zn-doped and Zn/Se co-doped p-type $Al_{0.20}Ga_{0.80}As$ semiconductor.

FIG. 7—Characteristics of electron traps observed for co-doped p-type semiconductor.

DETAILED DESCRIPTION OF THE INVENTION

An aluminum-containing compound semiconductor crystal having a greatly reduced concentration of deep-level oxygen and germanium contaminants is manufactured by a process comprising the steps of: (1) providing a means for growing one or more aluminum-containing compound semiconductor crystals; (2) providing a means, connected to the growing means, for delivering selenium to the growing semiconductor crystals; (3) growing the semiconductor crystals; and (4) while the crystals are growing, simultaneously delivering thereto a predetermined concentration of selenium by way of the delivery means. In order to produce AlGaAs semiconductors which are free of deep-level impurities, the selenium doping conditions must be carefully controlled, as discussed more fully below.

By way of illustration of the method of the present invention, one or more semiconductor crystals comprising epitaxial layers of n-type $Al_xGa_{1-x}As$ semiconductors were grown in a conventional, horizontally configured, atmospheric-pressure MOCVD reactor. Although this example relates specifically to MOCVD-grown semiconductor crystals, the process of the present invention can be utilized in conjunction with any of the known and commercially-available semiconductor crystal growth techniques presently in use, including, but not limited to, molecular beam epitaxy. Furthermore, the process of the present invention is not limited to n-type semiconductor crystals, but, as illustrated below, also works effectively with p-type $Al_xGa_{1-x}As$ semiconductors which are co-doped with Zn.

Doping of N-Type Compound Semiconductor

In the first illustration (n-type semiconductor), the semiconductor grown by MOCVD comprised $Al_{0.22}Ga_{0.78}As$. In growing the semiconductor crystal, no getters of any type were utilized to purify any of the source elements. Pd-cell purified $H_2$ was used as the carrier gas. The column III precursors were trimethylaluminum (TMAl) and trimethylgallium (TMGa). The column V precursor was pure arsine.

The semiconductor compound materials in this example were grown at a constant temperature of 730° C., with a precursor V/III ratio of 40, and a growth rate of 4.0 μm/hr. A 2-μm-thick $Al_{0.22}Ga_{0.78}As$ (Se-doped or undoped) layer was grown on n+-GaAs ($10^{18}$ cm$^{-3}$) substrates. The method of the present invention is not limited to these conditions, but can also operate effectively at different growth temperatures, precursor V/III ratios, and growth rates.

While the semiconductor crystal was being grown, selenium in gas form, $H_2Se$, in a concentration of 100 parts per million (ppm) in ultra high-purity $H_2$, was delivered to the MOCVD reactor by means of a commercially-available flow control device. This procedure allowed for the control of the concentration of selenium which was being delivered to the growing semiconductor crystal.

In this illustration, the final concentration of selenium delivered to the semiconductor was approximately $8.4 \times 10^{16}$ cm$^{-3}$, which was determined to be the minimum quantity of selenium required to reduce deep-level impurities. In doping the growing semiconductor, greater amounts of selenium may be used. However, in order for the selenium doping to have its intended effect of reducing the deep-levels associated with oxygen or germanium, the concentration of selenium utilized should not exceed approximately $2 \times 10^{17}$ cm$^{-3}$.

In order to confirm that the deep-level impurities were removed by the selenium doping, the level of contamination in the $Al_{0.22}Ga_{0.78}As$ layers was measured utilizing conventional deep level transient spectroscopy (DLTS) and a double-correlator DLTS (DDLTS). However, any technique which allows one to measure deep-level impurities may be utilized. The temperature scan range employed was in the range of 30° to 380° K. Data was collected by a computer through a high speed analog-digital converter board.

Schottky contacts, 700 μm in diameter, were made by evaporating Au through a metal mask onto the AlGaAs surface immediately after etching in a freshly prepared 2:1:1 $H_2SO_4:H_2O_2:H_2O$ solution for approximately 15 seconds. Ohmic contacts were made by evaporating AuGe/Au on the n+-GaAs substrate, and alloying in a forming gas (95%$N_2$+ 5%$H_2$) atmosphere at approximately 420° C. for approximately two minutes.

By way of illustration of the effects of selenium doping on deep-level semiconductor impurities using the method discussed above, reference is made to FIGS. 1 to 5. The DLTS spectrum for an undoped layer of $Al_{0.22}Ga_{0.78}As$, which had a selenium carrier concentration of $5.0 \times 10^{15}$ cm$^{-3}$, is shown in FIG. 1(a). Three main deep electron traps, E1, E2 and E3, are shown. These electron traps had activation energies of 0.70, 0.53 and 0.30 eV, and trap concentrations of $3.4 \times 10^{14}$ cm$^{-3}$, $3.6 \times 10^{14}$ cm$^{-3}$ and $3.8 \times 10^{13}$ cm$^{-3}$, respectively. These electron traps are commonly observed in MOCVD-grown AlGaAs semiconductors. The 0.30 eV trap E3 was attributed to germanium contamination. The 0.53 and 0.70 eV traps were attributed to oxygen contamination. Additionally, a shallow electron trap E4 was observed, with an activation energy of 0.08 eV.

FIG. 1 shows the DLTS spectrum for an $Al_{0.22}Ga_{0.78}As$ layer doped with a concentration of selenium of approximately $8.4 \times 10^{16}$ cm$^{-3}$, as obtained by C-V measurement. Under the detection limit ($10^{13}$ cm$^{-3}$) of the DLTS system, no deep levels were observed up to 380° K. Not only were the oxygen contamination-related traps E1 and E2 eliminated, but the germanium-related trap E3 were likewise erased. The relation between deep level densities and selenium doping concentrations is demonstrated in FIG. 2.

In order to confirm that the disappearance of the deep levels associated with oxygen and germanium was due to selenium doping, and not some other phenomena, a 200 Å selenium-doped ($5.0 \times 10^{17}$ cm$^{-3}$) $Al_{0.22}Ga_{0.78}As$ thin layer was grown on a GaAs substrate. Next, a 2-μm-thick undoped-$Al_{0.22}Ga_{0.78}As$ layer was grown on the same substrate. Because of a memory effect, residual selenium impurity in the undoped AlGaAs layer was anticipated, even though the source delivering the selenium was removed, and more selenium was expected near the surface region. The carrier concentration profile of this sample is shown in FIG. 3. As expected, an increased carrier concentration with distance away from the surface was observed due to the memory effect.

A DDLTS or other similar technique may be used to probe the depth distribution of trap concentrations in the semiconductor sample. The results for traps E1, E2 and E3 are shown, for example, in FIG. 4. Electron traps E1, E2 and E3 appeared to have larger concentrations near the surface, which decreased with distance away from the surface. In order to eliminate the possible annealing effect during the alloying for ohmic contacts, Schottky contacts on the AlGaAs surface were made by evaporating two contacts with different sizes (30:1). The reduction of the deep traps was confirmed to be due to the presence of the selenium impurity.

The memory effect in an AlGaAs layer due to low-selenium doping could last up to 1 μm thick during the MOCVD growth, as can be seen in FIGS. 3 and 4, and the undoped-AlGaAs layer within the memory effect had a very low trap concentration. The deep level concentrations of oxygen and germanium in selenium-doped $Al_{0.22}Ga_{0.78}As$ were more than one order of magnitude lower than those in the undoped $Al_{0.22}Ga_{0.78}As$. This result suggests that for optoelectronic and similar high-speed device applications, a deep-level-free AlGaAs layer with low carrier concentration can be achieved simply by growing the semiconductor compound on a thin selenium-doped buffer layer.

The reason that selenium doping reduces the oxygen and germanium deep traps in $Al_{0.22}Ga_{0.78}As$ is not known at the present time. It is believed, however that the reduction of traps E1 and E2 could be due to the reduction of oxygen incorporation caused by selenium doping. Moreover, when the concentrations of selenium doping in a n-type aluminum-containing semiconductor exceeds $2\times10^{17}$ cm$^{-3}$, a hole trap appears. FIG. 5, for example, shows a hole trap observed by DLTS in a selenium-doped $Al_{0.22}Ga_{0.78}As$ layer with a doping concentration of $5.0\times10^{17}$ cm$^{-3}$. By changing the reverse bias and/or pulse height, no peak shift for this trap was observed. This finding indicates that the hole trap could be a bulk trap in AlGaAs, and was related to the quantity of selenium added to the substrate.

The method of the present invention is not limited to the compound discussed in the above-illustration. Indeed, the preferred method of the present invention can be utilized during the growth of any aluminum-containing n-type compound semiconductor, including a semiconductor having as its constituent elements aluminum, gallium and arsenide in a ratio approximating that of $Al_xGa_{1-x}As$.

Doping of P-Type Compound Semiconductor

Selenium doping also results in the reduction of deep-level contamination of oxygen and germanium in p-type $Al_xGa_{1-x}As$ semiconductors. In the second illustration, samples of p-type $Al_xGa_{1-x}As$ were again grown in a conventional, horizontally configured, atmospheric-pressure MOCVD reactor. In growing the crystal, no getters of any type were required or utilized to purify any of the source elements. Pd-cell purified $H_2$ was used as the carrier gas. The column III precursors were trimethylaluminum (TMAl) and trimethylgallium (TMGa). The column V precursor was pure arsine.

The semiconductor compound materials in the second example were again grown at a constant temperature of 730° C., with a precursor V/III ratio of 40, and a growth rate of 4.0 μm/hr. Ohmic contacts were made by evaporating AuGe/Au on the n+-GaAs substrate, and then alloying in a forming gas (95%N2+5%H2) atmosphere at approximately 420° C. for approximately two minutes. DLTS was employed to characterize the electrical properties, and a range of temperature scan from 30° to 380° K. was utilized, with a constant heating rate of 0.25° K./s. The composition of Al was determined by double x-ray rocking curve measurements.

A 2-μm-thick Zn-doped (Zn flow rate at 5 cc/minute) or Zn/Se co-doped (Zn flow rate at 5 cc/minute and $H_2Se$ flow rate at 1 cc/minute) $Al_{0.2}Ga_{0.8}As$ layer was grown on a n+-GaAs substrate. Since the concentration of selenium ($8.0\times10^{16}$ cm$^{-3}$) was much less than that of Zn ($1.0\times10^{18}$ cm$^{-3}$), both samples had the same net carrier concentration of about ($1.0\times10^{18}$ cm$^{-3}$).

FIG. 6 shows the DLTS spectra for Zn-doped and Zn/Se co-doped $Al_{0.2}Ga_{0.8}As$ samples. Five hole traps were observed in the Zn-doped sample. Two main hole traps H2 and H3 had activation energies of 0.39 and 0.37 eV, and concentrations of $3.1\times10^{14}$ cm$^{-3}$ and $4.6\times10^{14}$ cm$^{-3}$, respectively. The characteristics of each of these traps are shown in FIG. 7.

In contrast to the Zn-doped sample, these main hole traps disappeared when the crystal was co-doped with selenium, utilizing a co-doping concentration of approximately $8\times10^{16}$ cm$^{-3}$. Moreover, the trap densities in the selenium co-doped $Al_{0.2}Ga_{0.8}As$ semiconductor were at least one order of magnitude lower than those in the Zn-doped sample. This result shows that selenium doping may provide a passivation effect in Zn-doped p-type $Al_{0.2}Ga_{0.8}As$ semiconductors.

As with the n-type semiconductors, the method of the present invention is not limited to the compound discussed in the illustration. Indeed, the preferred method of the present invention can be utilized during the growth of any aluminum-containing p-type compound semiconductor.

What we claim is:

1. A process for reducing contaminants from a p-type aluminum-containing semiconductor crystal, which process comprises:

providing a means for growing the p-type aluminum-containing semiconductor crystal;

providing a means for delivering an amount of selenium sufficient to reduce contaminants to the semiconductor crystal;

growing the semiconductor crystal; and while the semiconductor crystal is growing, introducing the contaminant reducing amount of selenium into the crystal by way of the delivery means.

2. A process as in claim 1, wherein the amount of selenium ranges from $8.0\times10^{16}$ cm$^{-3}$ to $1\times10^{17}$ cm$^{-3}$.

3. A process as in claim 1, wherein the p-type semiconductor compound comprises aluminum, gallium and arsenide in a ratio according to the formula $Al_xGa_{1-x}As$.

4. A process as in claim 3, wherein the p-type semiconductor compound has the formula $Al_{0.20}Ga_{0.80}As$.

5. A process as in claim 4, wherein the amount of selenium is approximately $8.0\times10^{16}$ cm–3.

6. A process as in claim 1, wherein the growing means comprises metalorganic chemical vapor deposition.

7. A process as in claim 1, wherein the growing means comprises molecular beam epitaxy.

8. A process for reducing deep-level contaminants from an aluminum-containing p-type semiconductor crystal, comprising the steps of:

providing a means for growing an aluminum-containing p-type semiconductor crystal;

providing a means for delivering selenium and zinc to the growing semiconductor crystal;

growing the semiconductor crystal; and while the semiconductor crystal is growing, simultaneously co-doping the semiconductor with an amount of selenium sufficient to reduce deep-level contaminants and zinc.

9. A process as in claim 8, wherein the semiconductor crystal comprises a p-type semiconductor compound having as its constituents aluminum, gallium and arsenide in according to the formula $Al_xGa_{1-x}As$.

10. A process as in claim 9, wherein the semiconductor crystal comprises a compound having the formula $Al_{0.20}Ga_{0.80}As$.

11. A process as in claim 10, wherein the amount of selenium is approximately $8.0\times10^{16}$ cm$^{-3}$, and the amount of zinc is approximately $1.0\times10^{18}$ cm$^{-3}$.

* * * * *